United States Patent [19]

Chan et al.

[11] Patent Number: 5,315,167
[45] Date of Patent: May 24, 1994

[54] VOLTAGE BURN-IN SCHEME FOR BICMOS CIRCUITS

[75] Inventors: Yuen H. Chan, Poughkeepsie; Anthony R. Pelella, Highland Falls; William R. Reohr, Glenham, all of N.Y.

[73] Assignee: International Business Machines Corporation, Armonk, N.Y.

[21] Appl. No.: 865,591

[22] Filed: Apr. 9, 1992

[51] Int. Cl.[5] .......................................... H03K 17/16
[52] U.S. Cl. .............................. 307/296.6; 307/296.7; 307/570
[58] Field of Search ............... 307/296.1, 296.3, 296.6, 307/296.7, 296.8, 443, 455, 456, 494, 490, 491, 495, 467, 570, 475, 264; 365/227; 323/313, 337, 282

[56] References Cited

U.S. PATENT DOCUMENTS

| | | | |
|---|---|---|---|
| 4,336,495 | 6/1982 | Hapke | 324/158 T |
| 4,625,129 | 11/1986 | Ueno | 307/446 |
| 4,713,560 | 12/1987 | Herndon | 307/296.3 |
| 4,821,238 | 4/1989 | Tatematsu | 365/201 |
| 4,855,672 | 8/1989 | Shreeve | 324/158 R |
| 4,918,334 | 4/1990 | Correale, Jr. et al. | 307/296.3 |
| 4,958,094 | 9/1990 | Ishii et al. | 307/296.3 |
| 4,967,146 | 10/1990 | Morgan et al. | 324/158 R |
| 4,994,688 | 2/1991 | Horiguchi et al. | 307/296.8 |
| 5,028,820 | 7/1991 | Sullivan | 307/491 |
| 5,030,908 | 7/1991 | Miyoshi et al. | 324/158 R |
| 5,184,031 | 2/1993 | Hayakawa et al. | 307/296.1 |
| 5,189,316 | 2/1993 | Murakami et al. | 307/296.1 |

OTHER PUBLICATIONS

IBM Technical Disclosure Bulletin, vol. 33, No. 10B, Mar. 1991, Bicmos Emitter-Coupled Logic Converter for Extended Voltage Operation, pp. 388-389.

Primary Examiner—Timothy P. Callahan
Assistant Examiner—My-Trang Nu Ton
Attorney, Agent, or Firm—Whitham & Marhoefer

[57] ABSTRACT

A switchable voltage generator is provided on-chip together with circuitry including transistors formed in accordance with several different technologies and optimized for operation at different voltages. Provision of a voltage generator on the chip avoids the need for dedicated connections for the lower voltage or voltages. To provide similar levels of burn-in voltage to the different transistor types, a bypass or shunt is provided across the regulator of the voltage generator. The on-chip voltage generator avoids the requirement for a large number of chip or module power connections for each supply voltage required in order to meet current requirements of different portions of chip circuitry. The use of a mode select receiver also avoids the requirement of additional connections to the chip. The combination of one or more switchable voltage generators with a mode select receiver allows economical and efficient electrically stressed testing of the chip at different levels of manufacture.

18 Claims, 4 Drawing Sheets

VOLTAGE BURN-IN SCHEME FOR BICMOS CIRCUITS

BACKGROUND OF THE INVENTION

1. Field of the Invention

The present invention generally relates to the design and manufacture of integrated circuit devices and, more particularly, to the electrical stress testing of integrated circuit devices, especially those containing transistors of different types.

2. Description of the Prior Art

The change of electrical characteristics of electrical components due to thermal and electrical stress during use is well-recognized. In some applications, particularly involving semiconductor devices, therefore, it is a common practice to operate a device for a sufficient period of time to stabilize the electrical characteristics of the device or component before placing it in service. This process can often be accelerated by operation of the device or component under adverse conditions of elevated temperature and/or increased operating voltages. Such operation is commonly referred to as burn-in.

In semiconductor devices and integrated circuits, in particular, burn-in is especially useful since latent defects such as improperly formed conductors which could cause unexpected failure during field operation will often fail during burn-in. Also, further diffusion of impurities, given a predetermined distribution in portions of the device, could be redistributed under adverse thermal or electrical conditions to drastically alter the electrical characteristics or cause failure of the device.

This latter consideration has become of major importance as transistor sizes have been reduced in integrated circuit devices. This is particularly true of field-effect transistors (FET's as channel lengths have been reduced below one micron. However, as improvements in technology have reduced the sizes of individual elements in integrated circuits, the electrical conditions under which such elements are optimally operated have become more critical. The same is true for burn-in operation. For example, in integrated circuit devices containing both bipolar transistors and CMOS transistors, the bipolar transistors are often optimized for operation at 3.6 volts while CMOS FET's, commonly integrated on the same chip with such bipolar devices are optimized for operation at 2.5 volts due to channel length and gate oxide thickness constraints. Likewise, optimum burn-in voltages differ between the two technologies (e.g. bipolar and CMOS) due to breakdown considerations. For example, during burn-in, bipolar devices are preferably electrically stressed at up to 1.1 times the optimum operating voltage while CMOS FET's are preferably stressed at up to 1.5 times the optimum operating voltage. This difference is at least in part due to the difference in conduction phenomena between the two devices since conduction occurs across a junction in a bipolar device but not in FET's, where conduction is controlled by the extent of a depletion region within a junctionless channel.

Burn-in has virtually become an indispensable requirement in the manufacture of integrated circuits having highly miniaturized transistors in order to assure an acceptable level of reliability. Therefore, arrangements for conducting such burn-in and testing operations have become an integral part of the design of such integrated circuits. However, all such arrangements, to date, have imposed some requirement on device design or manufacturing process which is at least expensive or time-consuming or requires substantial structure to be fabricated integrally with the device which is not thereafter usable. For example, U.S. Pat. No. 5,030,908 to Miyoshi et al. uses an electron beam to place a charge on a predetermined area of an integrated circuit and discharge is observed over time to determine the electrical characteristics of the device. U.S. Pat. No. 4,821,238 to Tatematsu teaches the provision of an on-chip test pattern generator. U.S. Pat. No. 4,855,672 to Shreeve discloses the provision of on-chip test circuitry usable in combination with a continuous lead-frame structure in the form of a tape which allows a plurality of integrated circuits to be wound on reels and thermally stressed while being simultaneously tested. U.S. Pat. No. 4,967,146 to Morgan et al teaches the provision of grooves on a wafer which facilitates burn-in and location of contacts for testing and later disassembly of the wafer into individual chips.

Another approach involves the use of a separate burn-in power supply lead which is not thereafter used. This approach requires an additional power plane in the integrated circuit and/or module carrying the integrated circuit and a pin which is either floated (if the two normal operating voltages are provided on-chip from the same power supply) or tied to the Vcc power plane (if on-chip voltage conversion is not provided) during normal operation. This requires some modification of the physical and electrical environment in which the integrated circuit is to be used as well as significant additional structure within the integrated circuit device, itself U.S. Pat. No. 4,336,495 to Hapke teaches the provision of on-chip switching for the purpose of testing which involves the application of a voltage which is outside the normal operating range of the device, such as a voltage of opposite polarity to normal operating voltage, in order to avoid the provision of an additional module pin. However, such an approach is not applicable to either electrical stressing of the circuit or the selective provision of a particular burn-in supply voltage to selected transistors of an integrated circuit. Similarly, U.S. Pat. No. 4,625,129 to Ueno teaches on-chip power supply switching for the purpose of removing power from selected portions of an integrated circuit which is similarly inapplicable to the provision of separate burn-in power supply voltages. Horiguchi U.S. Pat. No. 4,944,688, presents a very detailed description of the design of a fixed reference voltage generating circuit and is exemplary of the complexities which may be encountered for powering large integrated circuits even in the case of voltage generators which are not switchable and do not provide burn-in voltage generation capability. Distribution of $V_L$ circuits among the memory cell arrays powered thereby is shown in FIG. 4 of Horiguchi et al. This approach increases overall power consumption and consumes additional chip space.

A BICMOS logic converter for the purpose of burn-in operation of a bipolar emitter coupled logic (ECL) circuit is taught in IBM Technical Disclosure Bulletin, Vol. 33, No. 10B, published in March 1991. The purpose of this circuit is to allow operability of the bipolar ECL circuit when $V_{DD}$ is raised under burn-in operation conditions. In this circuit, a field effect transistor is used to alter a load resistance of an amplifier circuit which receives an input from a reference voltage source. The change of load resistance boosts the gain of the amplifier and raises the output voltage swing.

SUMMARY OF THE INVENTION

It is therefore an object of the present invention to provide an on-chip voltage regulator for developing an optimum operating voltage for transistors according to one technology from a power supply voltage provided for transistors of another technology which are also integrated on the chip.

It is another object of the present invention to provide one or more switchable voltage regulators which can be integrated on a chip with other circuitry to provide one or more selected voltages for electrically stressing such other circuitry.

It is a further object of the present invention to provide a switchable on-chip voltage regulator for selectively providing either an optimum operating voltage for at least some transistors on the chip or an unregulated voltage applied to the integrated circuit device.

In order to accomplish these and other objects of the invention, a switchable voltage generator circuit is provided including an input voltage supply terminal, a voltage regulator having an input, connected to the input voltage supply terminal, and an output, and a pull-up means for connecting the input and the output of said voltage regulator.

In accordance with another aspect of the invention, a method is provided for electrically stressing an integrated circuit including a voltage generator for supplying one of at least two voltages to different portions of said integrated circuit comprising the steps of applying a predetermined voltage to the voltage generator and at least one portion of the integrated circuit, and bypassing the voltage generator.

In accordance with a further aspect of the invention, a switchable voltage source is provided including at least one emitter-coupled regulator transistor having a collector terminal connected to a voltage source, a bias circuit connected to a base terminal of the emitter coupled regulator transistor, a current source connected to an emitter terminal of the regulator transistor, and selectively controllable pull-up means for selectively bypassing the regulator transistor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
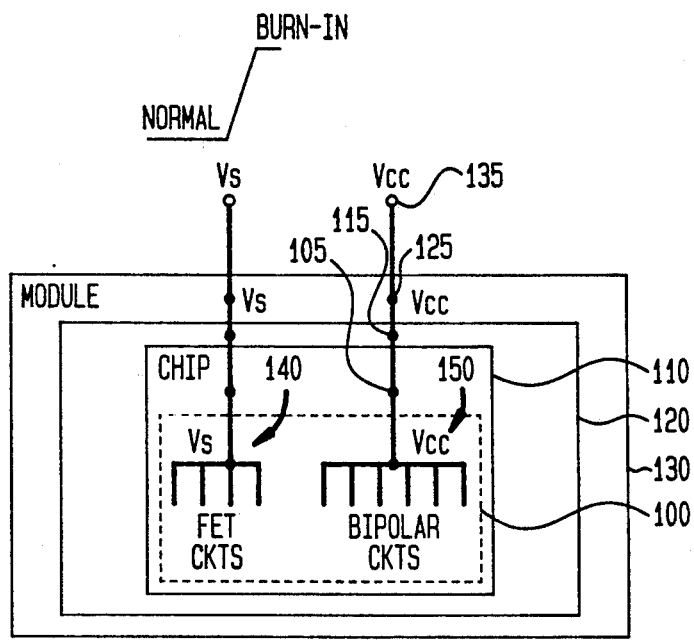
FIG. 1 is a schematic illustration of a prior burn-in scheme.

Referring now to the drawings, and more particularly to FIG. 1, a burn-in scheme over which the present invention is an improvement is schematically shown. This burn-in scheme is specifically not admitted to be prior art as to the present invention but is discussed herein for the purpose of contrast with the present invention in order to better convey an understanding thereof. As illustrated, an exemplary integrated circuit device 110, containing chip 100 is shown as being mounted on a carrier 120 contained in a module 130. This is a common construction at the present time but it is to be understood that not all of these elements need to be present in the environment of the invention.

What is, in fact, significant is that between the chip 100 and connection pins of the integrated circuit 110, a lead frame will be required, as indicated by connection 105. Between the device 110 and the carrier 120, another connection 115 (typically a so-called controlled collapsible chip connector, commonly referred to as a C4 pad, which includes a preform which changes dimensions in a predetermined manner as the connection is made) will be required. Similarly, the carrier or module will also contain further connections, symbolically indicated by connection 125, and Connection to the electrical apparatus is shown at 135. It is also important to understand that the power connections Vcc and Vs are also only schematically illustrated. Due to the small cross-sectional area of chip and module connections, each of the power supply connections will be substantially multiplied in order to carry sufficient current for the different portions of circuitry of the chip. Often, as many as one hundred such connections will be provided for each required voltage. If separate power supply connections are provided for Vcc and Vs, these connections 105, 115, 125 and 135 are correspondingly further multiplied, and a separate power supply must be provided. This is particularly significant since, in many commercial devices, connection 125 is formed as a separate layer of the module referred to as a power plane. Accordingly, a separate insulator and conductor layer pair would also be necessary to form a second power plane for Vs, thus complicating and increasing the cost of the device.

Figure 2:
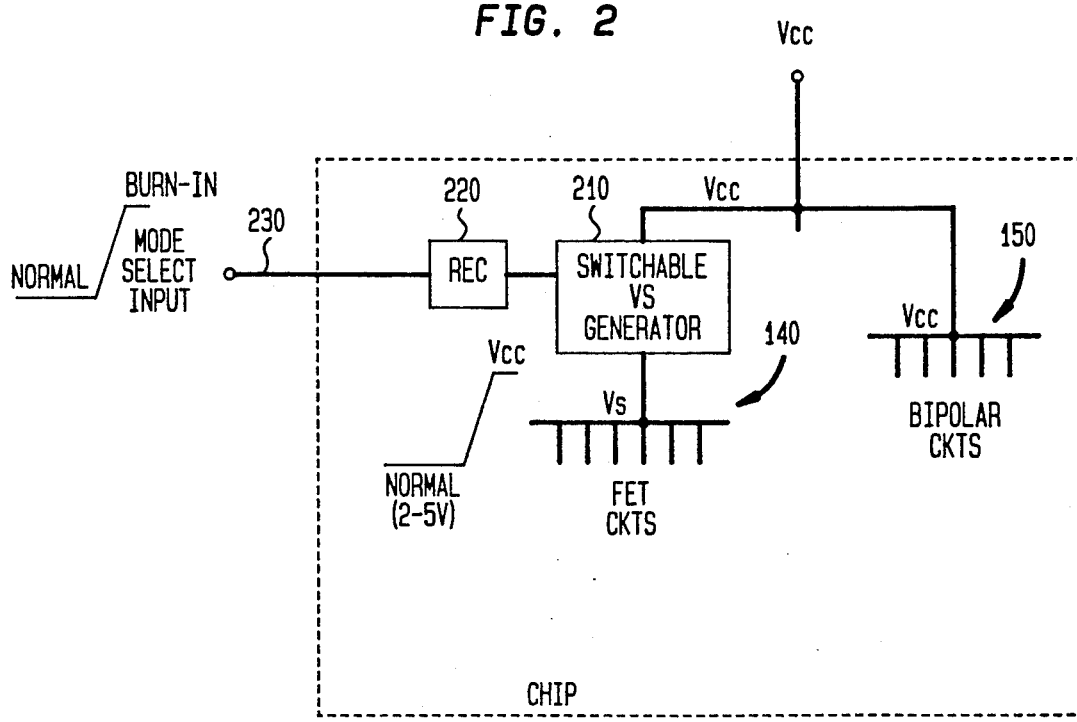
FIG. 2 is a schematic illustration of the burn-in scheme according to the present invention.

Referring now to FIG. 2, the arrangement according to the invention is shown. Only the chip itself is indicated by a dashed line since other connections will be similar to the Vcc connection of FIG. 1. Accordingly, the invention broadly comprises a switchable voltage converter for generating Vs responsive to an input signal from receiver 220 which preferably includes a register or latch as the output stage thereof. Other details of this receiver are unimportant to the practice of the invention, but it is preferable that the receiver include some arrangement such as the Hapke patent, cited above, to avoid the requirement of an additional pin to carry the mode select signal input 230. However, it is to be noted that terminal 230 is now a signal lead and need not be multiplied in order to carry increased current. Therefore, even if a separate pin or terminal is provided to carry the mode select signal, a saving of a significant number of connections will already have been achieved. It is also to be understood that latching of the mode select signal can be done on the module level rather than the chip level and the provision of a separate connection from the chip to the module need not imply a requirement for a dedicated pin on the module.

As noted above, the transistors of the bipolar circuits to which the invention is most readily and advantageously applied are optimized for operation at $Vcc = 3.6$ volts and the CMOS FET's are optimized for operation at $Vs = 2.5$ volts or other operating voltages in approximately the same ratio such as the more common industry standard of $Vcc = 5.0$ volts and $Vs = 3.3$–$3.4$ volts.

Applying the above-noted burn-in voltage multipliers to these normal operating voltages, burn-in voltages of 3.96 and 3.75 volts are obtained, respectively, yielding a differential of only 0.21 volts. (For the cited industry standard, the voltages would be Vcc (burn-in)=5.5 volts and Vs (burn-in)=4.95-5.1 volts, yielding a differential of approximately 0.4-0.5 volts.) Therefore, it is seen that a single voltage converter 210 can provide Vs from Vcc at either a normal voltage and a burn-in voltage if a burn-in voltage is applied as Vcc and Vs can be pulled sufficiently close thereto. If Vcc is regulated the voltage differential represents only slightly over 5% thereof (approximately 10% for the noted industry standard voltage values) and further regulation should not ordinarily be necessary. By the same token, Vs cannot exceed Vcc and the 5%-10% differential is not sufficiently great to cause damage or destruction of the CMOS FET circuitry 140 even if Vs is directly connected to Vcc.

Figure 3:
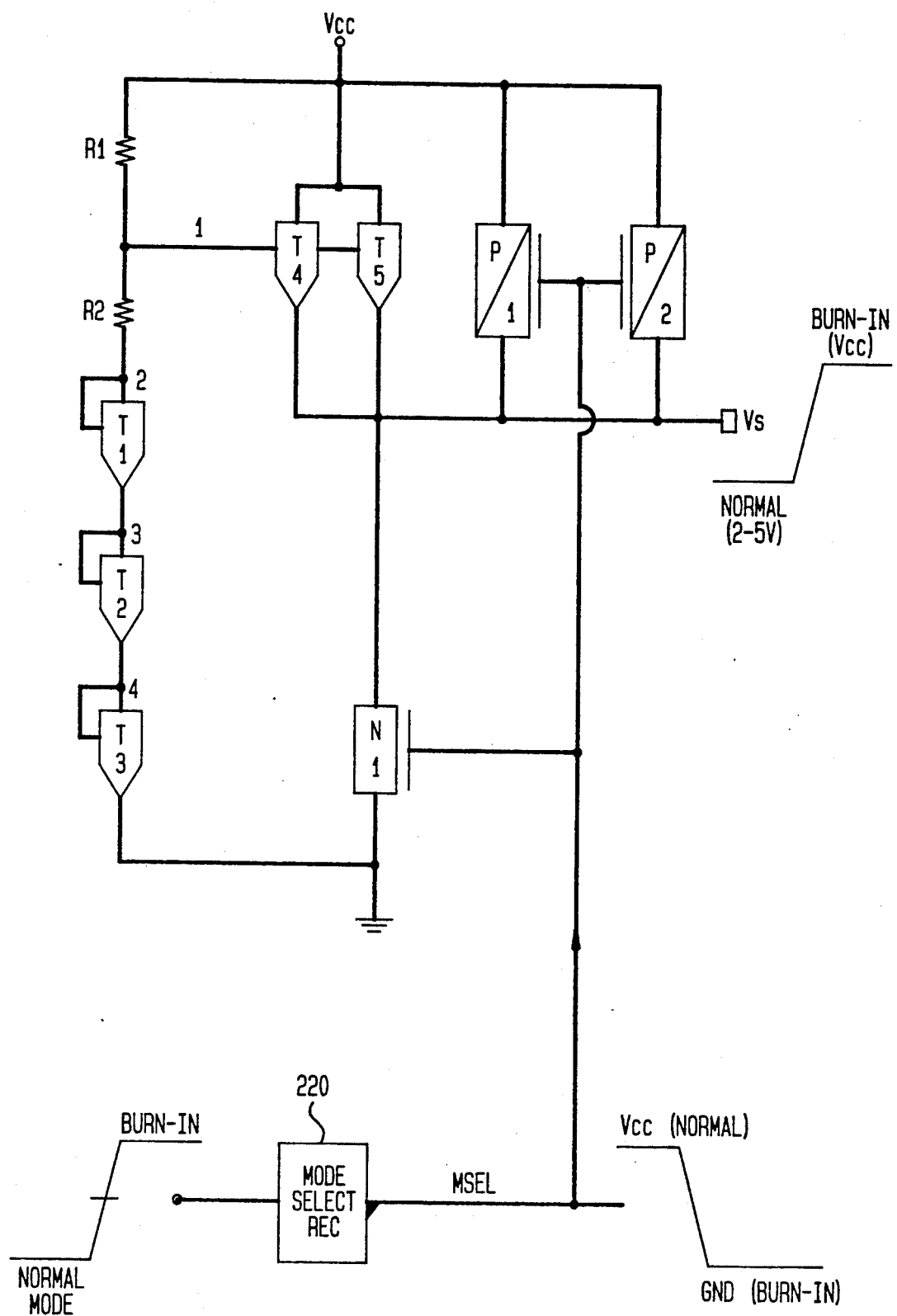
FIG. 3 is a circuit diagram of a first preferred embodiment of the present invention.

Referring now to FIG. 3, the manner in which the present invention satisfies these requirements will now be explained For normal operation, NPN transistors T1-T5 form a simple voltage regulator circuit Transistor T1, T2 and T3 are diode-connected and placed in series to provide temperature compensation. More or fewer such diode-connected bipolar transistors may be so provided to obtain the desired degree of compensation. Additionally, in series with the diode-connected transistors, $R_1$ and $R_2$ provide a voltage divider to establish the voltage applied to the bases of regulator transistors T4 and T5, which are connected in parallel. Again, more or fewer parallel transistors may be provided to carry the anticipated current required by circuits which receive Vs. An N-FET N1 is connected between the emitters of the parallel emitter follower-connected regulator transistors T4 and T5 and ground or other reference voltage. During normal operation, a high-level of the mode select signal MSEL is provided from the mode select receiver 220 to render N1 conductive. Thus, N1 serves as a pull-down current source for the emitter follower regulator transistors to stabilize the Vs output during normal operation. Other forms of emitter-follower pull-down such as resistor pull-down or another suitable form of current source pull-down can be used to perform the same function.

From the circuit topology shown in FIG. 3, the compensated or regulated Vs output voltage for normal operation $$Vs = \frac{R_2}{R_1 + R_2} Vcc + \frac{(2R_1 - R_2)}{R_1 + R_2} V_{be}$$

where $V_{be}$ is the junction voltage of an NPN transistor, or about 0.8 volts. By adjusting $R_1$ and $R_2$, different Vs magnitudes can be obtained to meet various circuit or device requirements.

Two or more PMOS transistors P1, P2 are provided in parallel to the regulator transistors T4 and T5. During burn-in operation, MSEL is of a low level and renders the pass gate formed by the parallel-connected PMOS transistors P1 and P2 conductive to effectively shunt the regulator of the circuit and pull Vs close to Vcc. The low-level MSEL signal also turns off N1 to avoid the formation of a voltage divider by the series connection of N1 with P1 and P2 which would otherwise reduce the pull-up of Vs.

It should be noted that the Vs burn-in voltage can be also adjusted by the provision of additional or reduced resistance to the pass gate. Resistance of the pass gate can be adjusted by either trimming the gate voltage applied to P1 and P2 or the provision of more or fewer transistors in the pass gate. It is deemed preferable in the practice of the invention to establish the number of PMOS transistors of the pass gate and the minimum resistances thereof in accordance with the desired differential, if any, between the burn-in value of Vcc and the burn-in value of Vs and the anticipated current load of the circuitry receiving Vs.

Figure 4:
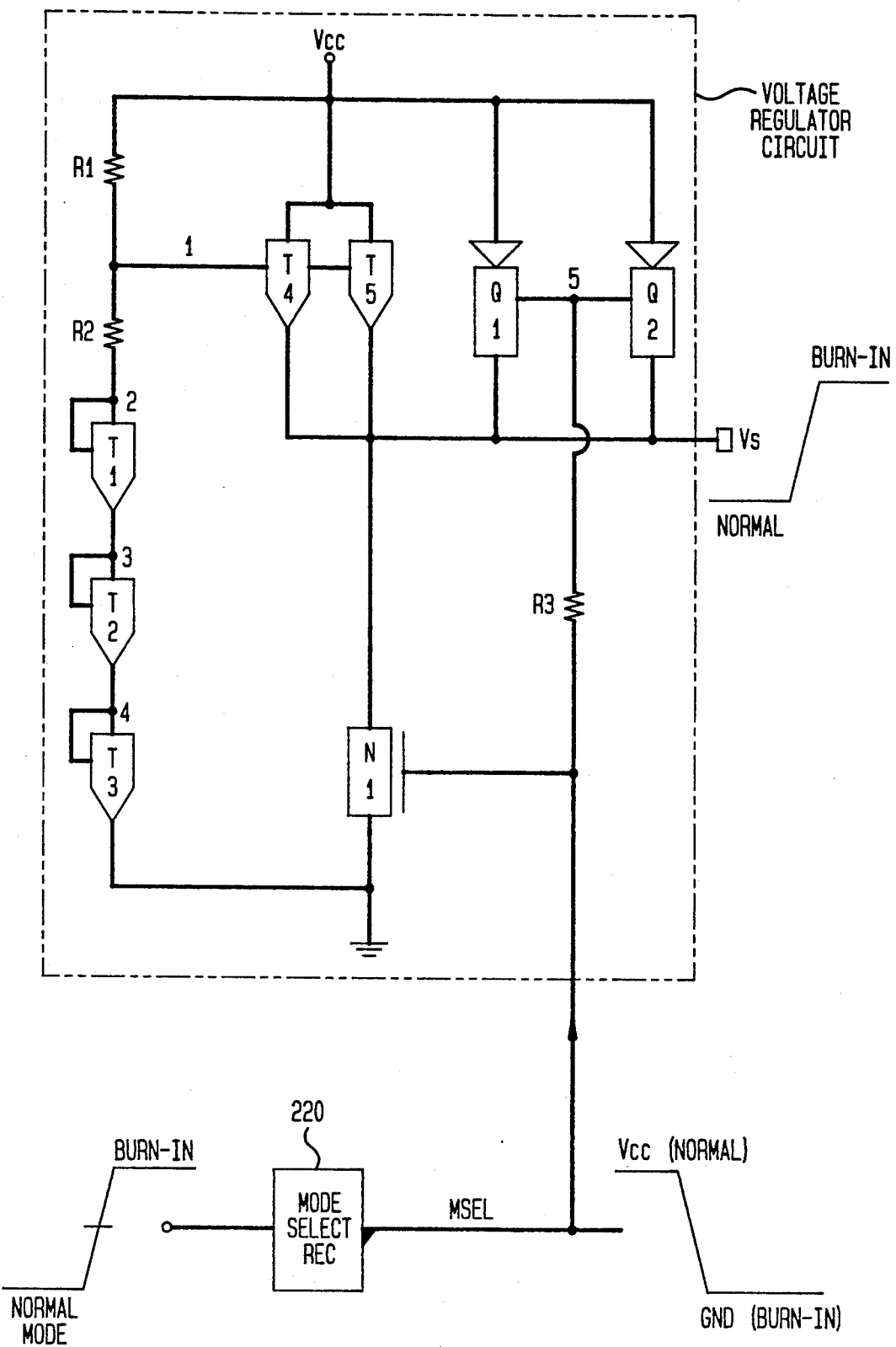
FIG. 4 is a circuit diagram of a second preferred embodiment of the invention.

While the voltage regulator described in connection with FIG. 3 utilizes PMOS transistors to raise the Vs potential relative to Vcc or, preferably, Vcc (burn-in) for burn-in mode operation, different types of pull-up devices can also be used. Such a substitution may be desirable due to the transistor technologies employed in fabrication of other circuitry on the chip. As an example of another pull-up arrangement, FIG. 4 shows a second embodiment of the voltage regulator in accordance with the invention which uses parallel-connected PNP transistors Q1 and Q2 for pull-up. As with the embodiment of FIG. 3 more or fewer such pull-up transistors may be used to provide the required current. The remainder of the circuit topology is identical to FIG. 3 and description thereof need not be repeated.

In the case of the embodiment of the invention shown in FIG. 4, the output voltage Vs is given by the equation:

$$Vs\ (burn\text{-}in) = Vcc - Vces$$

where Vces is the collector to emitter voltage of the PNP transistor at saturation which is typically less than 0.1 volts. This provides a pull-up of Vs to a value very close to Vcc and may be useful for advanced bipolar technologies where burn-in voltage is critical or greater electrical stress on the CMOS circuitry is desired.

Figure 5:
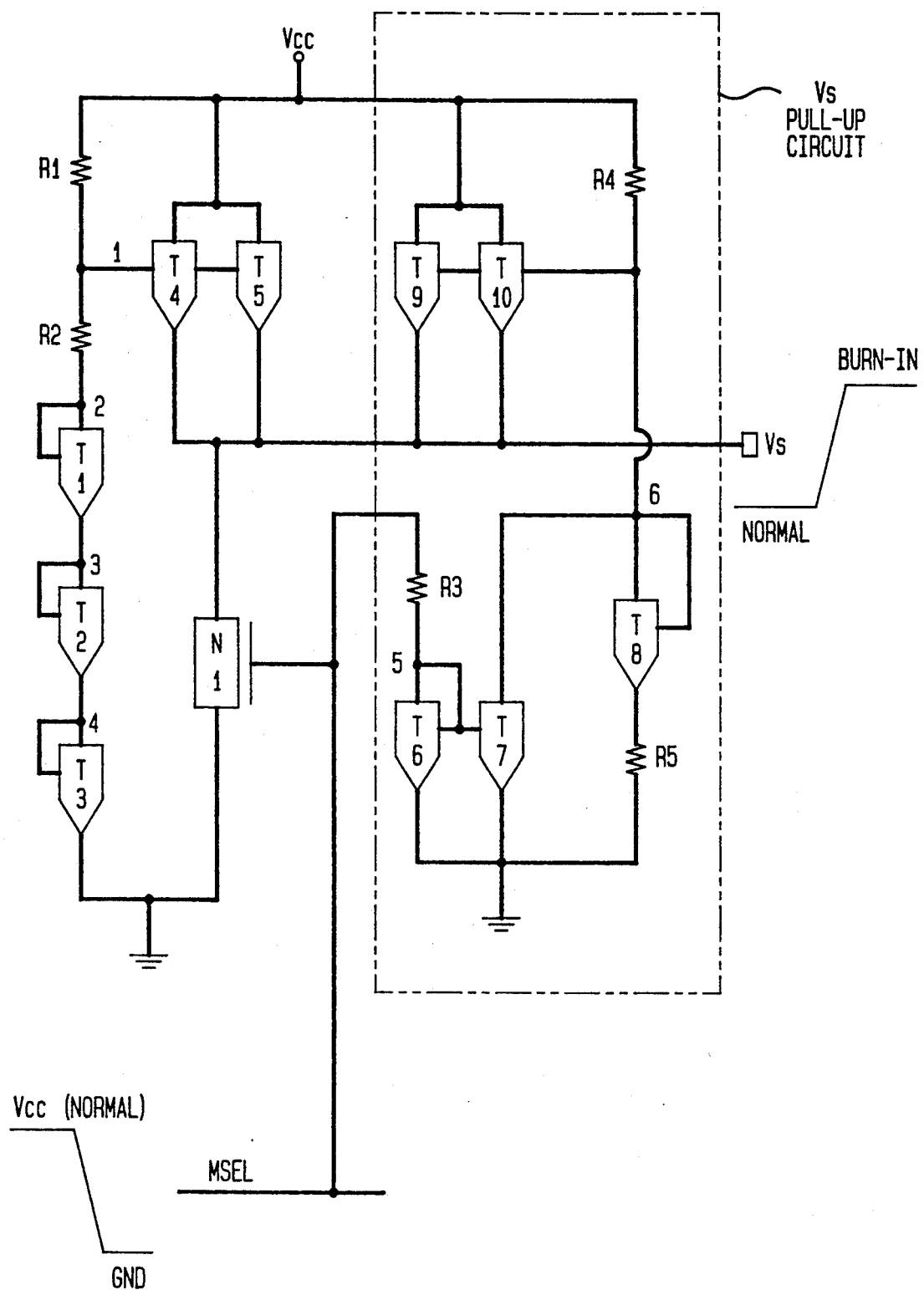
FIG. 5 is a circuit diagram of a third preferred embodiment of the invention.

A further embodiment of the invention is shown in FIG. 5. As noted above, when Vs is pulled very close to Vcc and Vcc is otherwise regulated, regulation of Vs (burn-in) may not be required. The embodiment of FIG. 5, however, can provide regulation of both Vs and Vs (burn-in) should regulation be desired or required. Such regulation would be particularly desirable if a substantial voltage differential (e.g. more than, say, 0.5 volts) between Vcc (burn-in) and Vs (burn-in), for example Vcc or Vcc (burn-in)=5.0 volts, Vs=2.5 volts and Vs (burn-in)=3.6 volts.

The circuit topology of FIG. 5 includes the same type of regulator circuit for Vs as shown in FIG. 3 including transistors T1-T5 and a pull-down arrangement, again depicted as a pull-down current source N1. As before, however, it is to be understood that other voltage regulator arrangements can be used. The Vs pull-up circuit for providing a regulated Vs (burn-in) voltage, according to the embodiment of FIG. 5, also comprises a regulator circuit with regulator transistors T9 and T10 connected in parallel with Vs regulator transistors T4 and T5. Bias for controlling the regulated Vs (burn-in) voltage is developed through a voltage divider including $R_4$ and P5. Temperature compensation is provided at diode connected transistor T8 in a manner well-understood in the art and the illustrated temperature compensation arrangement may be modified within the scope of the invention. Switching of the Vs pull-up circuit is accomplished by the current mirror topology including $R_3$, T6 and T7. $R_3$ is provided to limit input signal current. In normal operation when the mode select signal MSEL is of a high logic level, T7 conducts and pulls down the voltage applied to the bases of T9 and T10 through resistor P4 to render both transistors non-conductive. However, when MSEL is brought to a low logic level, T7 is turned off and the bias to T9 and T10 is determined by the temperature compensated voltage divider including R4, R5 and diode-connected transistor T8. Therefore, the output voltage Vs (burn-in) is given by the equation:

$$V_s\text{(burn-in)} = \frac{R_5}{(R_4 + R_5)} (V_{cc} - V_{be}).$$

Therefore, by suitable adjustment of the resistance in the voltage divider, a predetermined value for Vs (burn-in) can be set, at will, by the circuit designer.

It should be noted that regulation of Vs (burn-in) can also be achieved in other ways within the scope of the invention. For example, in the circuit of FIG. 3, the pull-up transistors P1 and P2 could be removed and a single transistor, receiving the control voltage previously applied to the pull-up transistors, could be used to shunt a portion of R1 to establish a different bias voltage for regulator transistors T4 and T5. This arrangement may be preferable in some applications where the element count may be particularly critical but also may compromise the temperature compensation of the circuit.

It should also be noted that plural Vs generators in accordance with the invention can be provided on the same chip to satisfy various voltage and power requirements of transistors formed in accordance with different technologies on the chip. The extreme simplicity and low element count of the circuit minimizes its footprint on the chip so that several such circuits could be included without significantly reducing the amount of other circuitry which can be included on the chip.

In view of the foregoing, it is seen that, particularly for a combination of bipolar transistors optimized for operation at 3.6 volt and CMOS FET's optimized for operation at 2.5 volts or other desired voltages which may be have approximately the same ratio, that different burn-in voltages which are of even very similar levels can be provided from a burn-in or normal level of Vcc voltage while providing a regulated supply at a substantially changed voltage during normal operation. Other voltages values either regulated or unregulated can also be provided as desired. Thus, the invention, in addition to providing an extremely good solution to the provision of burn-in voltages for transistors of particular technologies; also eliminates the need for multiplication of power connections to the module or chip and also, if desired, a dedicated terminal (e.g a C4 pad) on the chip for the MSEL signal, thus reducing the chip footprint and a corresponding dedicated pin on the device or module. Further, since the circuit according to the invention is accessible on the chip even after final assembly, by virtue of the provision of a mode select receiver 220, electrical stressing and testing in an electrically stressed condition may be performed during system level tests as well as wafer level tests.

While the invention has been described in terms of a few embodiments, each of which may be preferred under particular design circumstances, those skilled in the art will recognize that the invention can be practiced with modification within the spirit and scope of the appended claims.

Having thus described my invention, what I claim as new and desire to secure by Letters Patent is as follows:

1. A switchable voltage generator circuit including
   an input voltage supply terminal,
   a voltage regulator having an input thereof connected to said input voltage supply terminal and an output, said voltage regulator including means for stabilizing an output voltage produced thereby, and
   a controllable pull-up means for selectively connecting said input and said output of said voltage regulator said controllable pull-up means including means for turning off said means for stabilizing said output voltage.

2. A switchable voltage generator as recited in claim 1, further including
   a mode select receiver having an output connected to and controlling said pull-up means.

3. A switchable voltage generator as recited in claim 2, wherein said mode select receiver includes a latch.

4. A switchable voltage generator as recited in claim 1, wherein said pull-up means comprises a pass gate.

5. A switchable voltage generator as recited in claim 4, wherein said pass gate includes at least one bipolar transistor.

6. A switchable voltage generator as recited in claim 4, wherein said pass gate includes at lea--t one field effect transistor.

7. A switchable voltage generator as recited in claim 1, wherein said pull-up means comprises a switchable voltage regulator circuit.

8. A method of applying and increased voltage to an integrated circuit including a voltage generator for supplying one of at least two voltages which are supplied to different respective portions of said integrated circuit, said method comprising the steps of
   applying a predetermined voltage to said voltage generator and at least one said portion of said integrated circuit, and
   bypassing said voltage generator.

9. A method as recited in claim 8, wherein said voltage generator is provided on said integrated circuit.

10. A method as recited in claim 8, wherein said bypassing step includes the further steps of
    receiving a mode select signal and
    bypassing said voltage generator in response to said mode select signal.

11. A method as recited in claim 10 including the further step of latching said mode select signal.

12. A method as recited in claim 8, wherein sa bypassing step includes shunting said voltage generator.

13. A method as recited in claim 10, wherein said bypassing step includes shunting said voltage generator.

14. A switchable voltage source including
    at least one emitter-coupled regulator transistor having a collector terminal connected to a voltage source,
    a bias circuit means connected to a base terminal of said at least one emitter coupled regulator transistor,
    a current source means connected to an emitter terminal of said at least one regulator transistor, and
    selectively controllable pull-up means for selectively bypassing said at least one regulator transistor.

15. A switchable voltage generator as recited in claim 14, wherein said pull-up means comprises a pass gate.

16. A switchable voltage generator as recited in claim 15, wherein said pass gate includes at least one bipolar transistor.

17. A switchable voltage generator as recited in claim 15, wherein said pass gate includes at least one field effect transistor.

18. A switchable voltage generator as recited in claim 14, wherein said pull-up means comprises a voltage regulator circuit.

* * * * *